United States Patent [19]

Tomiyasu et al.

[11] Patent Number: 5,784,248
[45] Date of Patent: Jul. 21, 1998

[54] METHOD OF MOUNTING SOLID ELECTROLYTIC CAPACITOR ONTO PRINTED CIRCUIT BOARD, AND ASSEMBLY OF THE CAPACITOR AND THE BOARD

[75] Inventors: Tomohiro Tomiyasu, Chikugo; Yasuo Kanetake, Kyoto, both of Japan

[73] Assignee: Rohm Co., Ltd., Kyoto, Japan

[21] Appl. No.: 832,910

[22] Filed: Apr. 4, 1997

[51] Int. Cl.[6] .................................................. H01G 9/00
[52] U.S. Cl. ........................ 361/523; 361/538; 361/275.4
[58] Field of Search ........................ 361/275.4, 760, 361/782, 811, 528, 529, 532, 534, 535, 538, 540; 257/788, 791; 29/25.03; 174/260, 52.2

[56] References Cited

U.S. PATENT DOCUMENTS

| | | | |
|---|---|---|---|
| 5,446,623 | 8/1995 | Kanetake | 361/760 |
| 5,459,641 | 10/1995 | Kuriyama | 361/760 |
| 5,502,614 | 3/1996 | Kuriyama | 361/534 |
| 5,504,647 | 4/1996 | Kuriyama | 361/534 |
| 5,608,602 | 3/1997 | Kuriyama | 361/534 |
| 5,638,253 | 6/1997 | Hasegawa | 361/535 |
| 5,644,281 | 7/1997 | Kuriyama | 337/405 |
| 5,661,628 | 8/1997 | Yamagami | 361/275.4 |

FOREIGN PATENT DOCUMENTS

3-30977  5/1991  Japan.

*Primary Examiner*—Kristine L. Kincaid
*Assistant Examiner*—Anthony Dinkins
*Attorney, Agent, or Firm*—Merchant, Gould, Smith, Edell, Welter & Schmidt

[57] ABSTRACT

A method and assembly are provided for mounting a solid electrolytic capacitor onto a printed circuit board including an anode pad and a cathode pad. The capacitor includes a capacitor element which has an anode and a cathode electrically separated by a dielectric substance. The cathode includes an outer cathode terminal layer formed over the element. The method includes the steps of removing a part of the cathode terminal layer to expose a flat anode terminal surface, attaching the element to the printed circuit board for bringing the cathode terminal layer into electrical connection with the cathode pad, electrically connecting the flat anode terminal surface to the anode pad via a metal wire, and enclosing the element in a resin member for protection.

16 Claims, 10 Drawing Sheets

METHOD OF MOUNTING SOLID ELECTROLYTIC CAPACITOR ONTO PRINTED CIRCUIT BOARD, AND ASSEMBLY OF THE CAPACITOR AND THE BOARD

BACKGROUND OF THE INVENTION

1. Field of the Invention

The present invention relates to a method of mounting a solid electrolytic capacitor onto a printed circuit board. More particularly, the present invention relates to a method of mounting a solid electrolytic capacitor which is small in size but large in capacitance, such as a tantalum or aluminum solid electrolytic capacitor, onto a printed circuit board. The present invention also relates to an assembly of such a solid electrolytic capacitor and a printed circuit board.

2. Description of the Related Art

Conventional surface mounting type solid electrolytic capacitors are disclosed in Japanese Patent Publication No. 3-30977 and U.S. Pat. No. 5,459,641 for example. The capacitors disclosed therein basically have a structure illustrated in FIG. 21.

Figure 21:
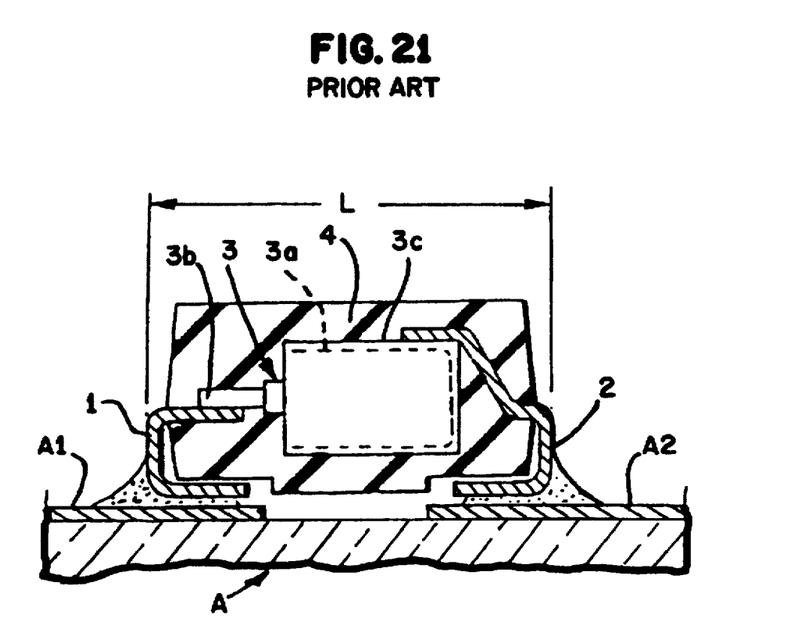
FIG. 21 is a sectional view showing a conventional solid electrolytic capacitor mounted on a printed circuit board.

Specifically, the illustrated capacitor has a capacitor element 3 which includes a chip 3a and an anode wire 3b projecting from the chip 3a. The chip 3a is formed with an outer cathode terminal layer 3c. The capacitor also has a pair of lead terminals, that is, an anode lead terminal 1 and a cathode lead terminal 2. The anode lead terminal 1 is connected to the anode wire 3b, whereas the cathode lead terminal 2 is connected to the the cathode terminal layer 3c. The capacitor element 3 together with part of the lead terminals 1, 2 are enclosed within a synthetic resin package 4 in a manner such that the lead terminals 1, 2 partially project from the package 4. The projecting portions of the lead terminals 1, 2 are bent under the package 4 so that the lead terminals are conveniently soldered to respective electrode pads A1, A2 formed on an upper surface of a printed circuit board A.

However, the above conventional capacitor has following problems.

First, in producing a capacitor having the above arrangement, it is necessary to perform cumbersome operations, such as a connecting operation of the lead terminals 1, 2 to the capacitor element 3, a molding operation of the package 4 to enclose the capacitor element 3, and a bending operation of the lead terminals 1, 2. These operations are quite complicated to perform and require strict quality control. Further, it is also required to perform a soldering operation for the printed circuit board A.

As a result, the cost in producing the conventional capacitor will substantially increase.

Second, the entirety of the capacitor element 3 is enclosed within the package 4 and the lead terminals 1, 2 are rendered to project from the package 4. Thus, the width and the length L tend to become large, thereby rendering the overall dimensions to be unduly large for the capacitor element 3. As a result, when the solid electrolytic capacitor capacitor is mounted on the printed circuit board, it occupies a large area on the board, thereby reducing a mounting density (the number of devices mounted in a unit area) of other devices for the printed circuit board.

Third, since a pair of lead terminals are needed for soldering the capacitor element to the printed circuit board, the weight of the capacitor is greatly increased.

Finally, in the conventional solid electrolytic capacitor, the chip 3a of the capacitor element 3 and the cathode lead terminal 2 may be mutually spaced to provide a safety fuse wire such as a temperature fuse, an overcurrent fuse or a fuse working for the both purposes. With such an arrangement, the overall length L is additionally increased, thereby further reducing the mounting density for the printed circuit board.

SUMMARY OF THE INVENTION

It is, therefore, an object of the present invention to provide a method of mounting a solid electrolytic capacitor onto a printed circuit board to overcome the problems described above.

It is also an object of the present invention to provide an assembly of a solid electrolytic capacitor and a printed circuit board obtained by such a method.

According to one aspect of the present invention, there is provided a method of mounting a solid electrolytic capacitor onto a printed circuit board; the printed circuit board comprising an anode pad and a cathode pad; the capacitor comprising a capacitor element which has an anode and a cathode electrically separated by a dielectric substance, the cathode including an outer cathode terminal layer formed over the element; the method comprising the steps of:

removing a part of the cathode terminal layer to expose a flat anode terminal surface;

attaching the element to the printed circuit board for bringing the cathode terminal layer into electrical connection with the cathode pad;

electrically connecting the flat anode terminal surface to the anode pad via a metal wire; and enclosing the element in a resin member for protection.

According to one embodiment of the present invention, the cathode terminal layer is brought into electrical connection with the cathode pad via another metal wire. In this instance, at least one of the metal wires may be a safety fuse wire.

According to another embodiment of the present invention, the electrical connection of the cathode terminal layer with the cathode pad is provided by an electrically conductive adhesive applied between the cathode terminal layer and the cathode pad. In this instance, the metal wire connecting the anode terminal surface to the anode pad is a safety fuse wire.

The anode may include a metal rod and the flat anode terminal surface is provided by this metal rod. Alternatively, the anode may include a metal plate and the flat anode terminal surface is provided by this metal plate.

According to another embodiment of the present invention, the anode includes a main portion and a protruding portion extending from the main portion before the partial removal of the cathode terminal layer, and the protruding portion has a mechanically weak region which facilitates detachment of the protruding portion from the main portion. The weak region may be provided by forming a cutout in the protruding portion.

According to another aspect of the present invention, there is provided an assembly of a solid electrolytic capacitor and a printed circuit board; the printed circuit board comprising an anode pad and a cathode pad; the capacitor comprising a capacitor element which has an anode and a cathode electrically separated from the anode by a dielectric substance, the cathode including an outer cathode terminal layer formed over the element, the element being attached to the printed circuit board for bringing the cathode terminal layer into electrical connection with the cathode pad, the element being enclosed in a resin member for protection, wherein a part of the cathode terminal layer is removed to expose a flat anode terminal surface which is electrically connected to the anode pad via a metal wire.

Other objects, features and advantages of the present invention will be clearer from the detailed explanation of the preferred embodiments described below with reference to the accompanying drawings.

DETAILED DESCRIPTION OF THE PREFERRED EMBODIMENTS

FIGS. 1–11 illustrate a first embodiment of the present invention.

Figure 1:
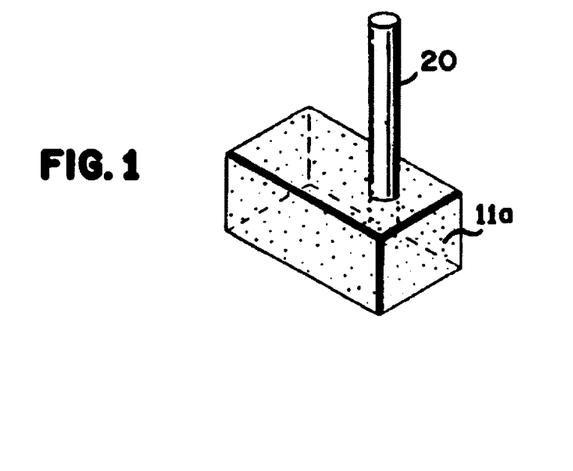
FIG. 1 is a perspective view showing a chip of a capacitor element used in the present invention.

A capacitor element 11 (see FIG. 7) used in the first embodiment of the present invention is produced in the following manner. First, as shown in FIG. 1, a porous chip 11a and an anode rod 20 projecting from the chip 11a are prepared. The chip 11a may be a sintered mass of tantalum powder for example, in which case the anode rod 20 is also made of tantalum. Then, the chip 11a is subjected to oxidation for forming a dielectric substance 11b (e.g. tantalum pentoxide) shown in FIG. 2. The formation of the dielectric substance 11b may be performed by anodic treatment in which the chip 11a is immersed in a phosphoric acid solution and then a direct current is passed across the chip 11a.

Figure 3:
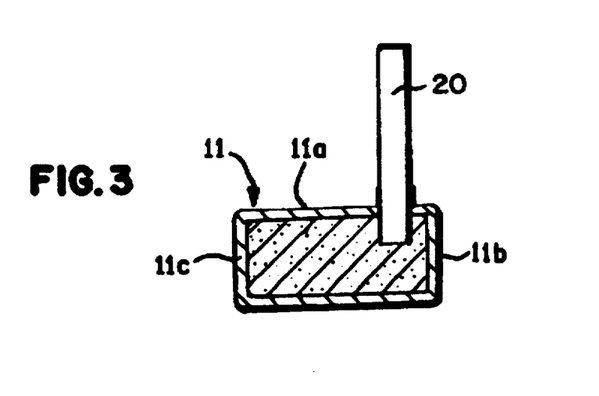
FIG. 3 is a sectional view showing the same chip of FIG. 1 with a cathode terminal layer formed on the chip.

Then, the chip 11a is subjected to chemical treatment for forming a solid electrolytic substance (e.g. manganese dioxide). In the treatment, the chip 11a is immersed in a manganese nitrate solution and raised out of the solution to be sintered. This operation is repeated several times. Thereafter, a graphite layer and a silver layer are formed on the chip 11a to produce a cathode terminal layer 11c as shown in FIG. 3.

Figure 4:
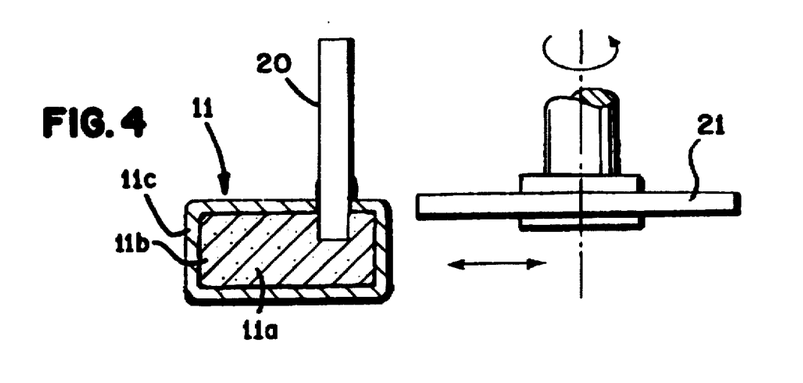
FIG. 4 is a sectional view showing the same chip of FIG. 3 before a partial removal operation of the cathode terminal layer.
Figure 5:
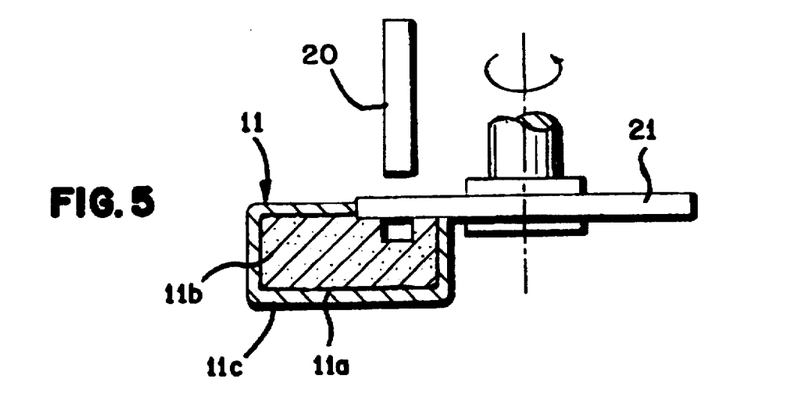
FIG. 5 is a sectional view showing the same chip of FIG. 3 being subjected to the partial removal operation of the cathode terminal layer.
Figure 6:
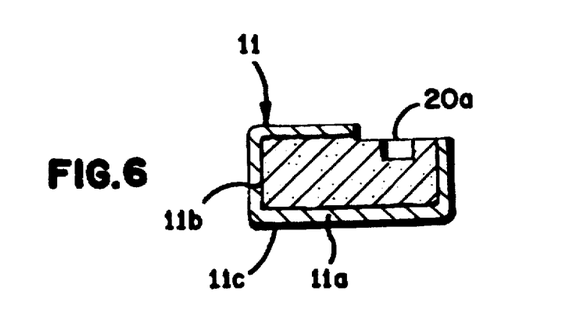
FIG. 6 is a sectional view showing the same chip after the partial removal operation of the cathode terminal layer.

Then, as shown in FIGS. 4 and 5, the cathode terminal layer 11c on the chip 11a is partially removed from a surface of the chip 11a by using a rapidly rotating cutter 21 for example. At this time, the projecting portion of the anode rod 20 is also removed or cut off as shown in FIG. 5. Thus, a flat surface of the anode wire is exposed to the exterior and this newly cut surface provides a flat anode terminal surface 20a (see FIGS. 6 and 7).

Thus produced capacitor element 11 is mounted on a printed circuit board in the following manner.

Figure 7:
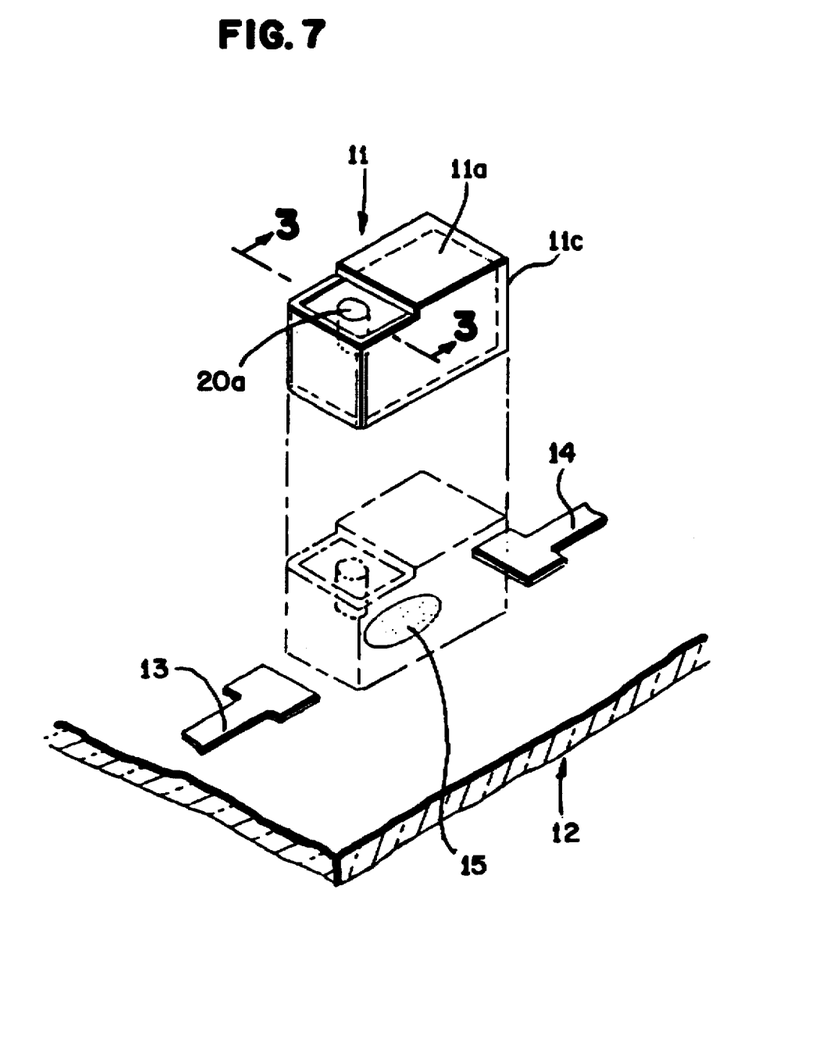
FIG. 7 is a perspective view illustrating the capacitor element of FIG. 6 which is about to be mounted on a circuit board.
Figure 8:
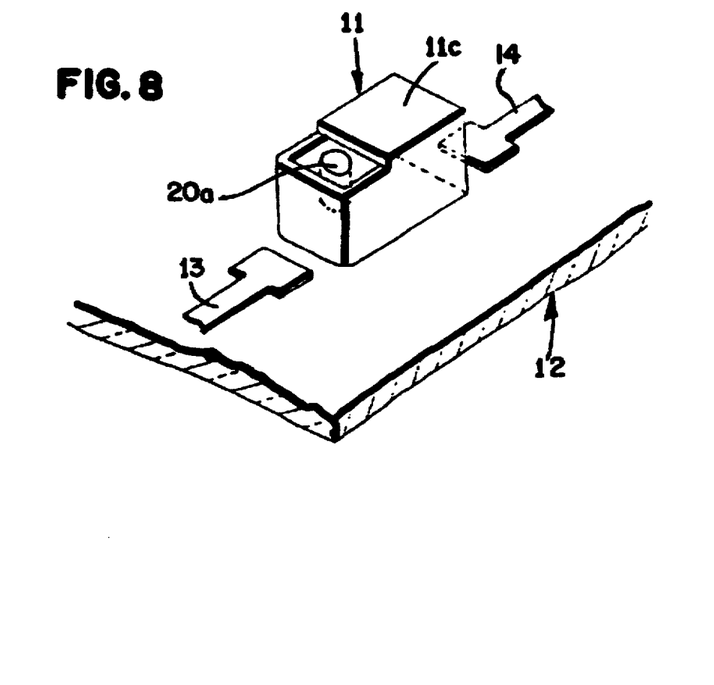
FIG. 8 is a perspective view showing the same capacitor element mounted on the circuit board.

As shown in FIG. 7, the circuit board 12 for carrying the capacitor element 11 is formed with an anode pad 13 and a cathode pad 14. These two pads are properly spaced from each other so that the capacitor element 11 is to be mounted on the board 12 between the two pads 13, 14. For the purpose of fixing the capacitor element 11 on the board 12, a suitable adhesive 15 is applied between the pads 13 and 14 on the board 12. In attachment of the element 11, the anode terminal surface 20a is arranged closer to the anode pad 13 (see FIG. 8).

Figure 9:
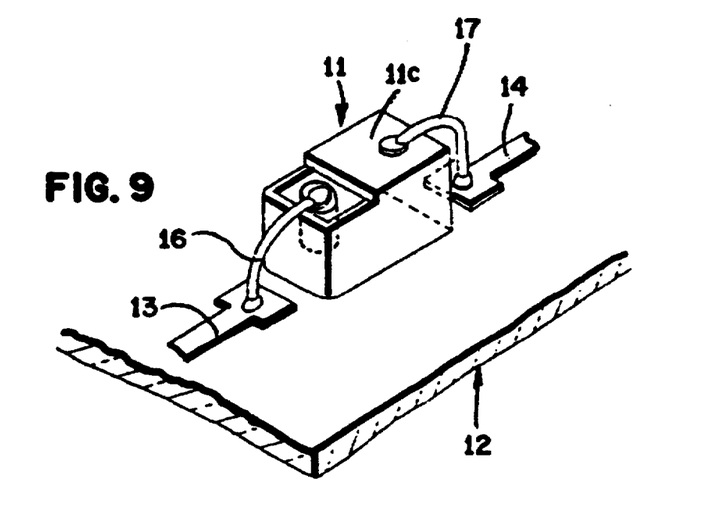
FIG. 9 is a perspective view showing the same capacitor element which is wire-bonded to the pads on the board according to an embodiment of the present invention.

Then, as shown in FIG. 9, the anode terminal surface 20a is electrically connected to the anode pad 13 via a suitable metal wire 16, whereas the cathode terminal layer 11c is electrically connected to the cathode pad 14 via another suitable metal wire 17. In the illustrated embodiment, the metal wire 17 is connected to the cathode terminal layer 11c at a top surface thereof. However, the connection of the wire 17 may be performed at another suitable point of the cathode terminal layer 11c. In this instance, at least one of the metal wires 16, 17 may be a safety fuse wire made of solder for example to work as a temperature fuse or an overcurrent fuse. Preferably, the fuse wire may be partially enclosed in an elastic arc-extinguishing resin member made of silicone resin for example.

Figure 10:
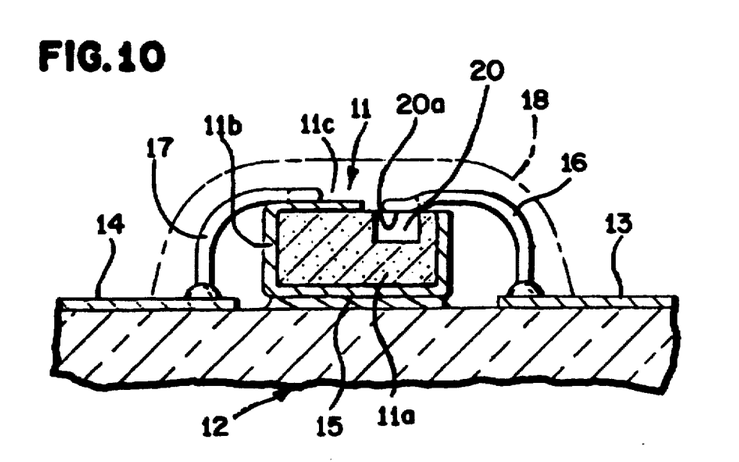
FIG. 10 is a sectional view showing the capacitor element and the circuit board carrying the element as shown in FIG. 9.
Figure 11:
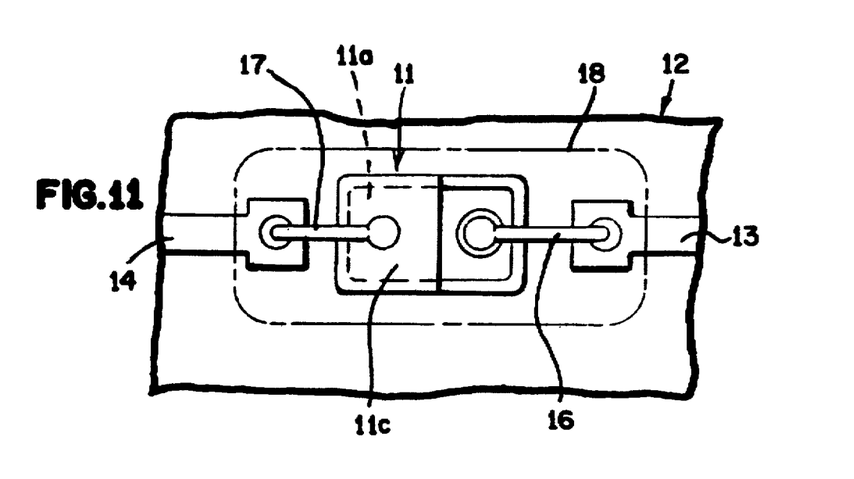
FIG. 11 is a plan view of FIG. 10.

Thereafter, as shown in FIGS. 10 and 11, the capacitor element 11 and the metal wires 16, 17 together with part of the pads 13, 14 are enclosed by a resin member 18 made of an epoxy resin for example to produce a product capacitor.

According to the process described above, since the obtained capacitor element 11 has no projecting anode wire from the chip 11c, the overall dimensions of the chip, especially the longitudinal dimension thereof is advantageously decreased. Further, since the anode terminal surface 20a and the cathode terminal layer 11c are wire-bonded to the pads 13, 14, there is no need to use lead terminals 1, 2 (see FIG. 21). As a result, the weight of the capacitor is reduced, while the production efficiency is greatly improved since there is no need to perform a cumbersome bending operation for the lead terminals 1, 2.

Still further, differing from the conventional resin package 4 molded into a predetermined configuration shown in FIG. 21, the resin member 18 according to the present invention does not require any complicated or accurate molding operation. In other words, the configuration of the resin member 18 can be provided in a substantially non-exact manner, as long as the resin member 18 with suitable dimensions protectively encloses the capacitor element 11, the wires 16, 17 together with part of the pads 13, 14.

Figure 12:
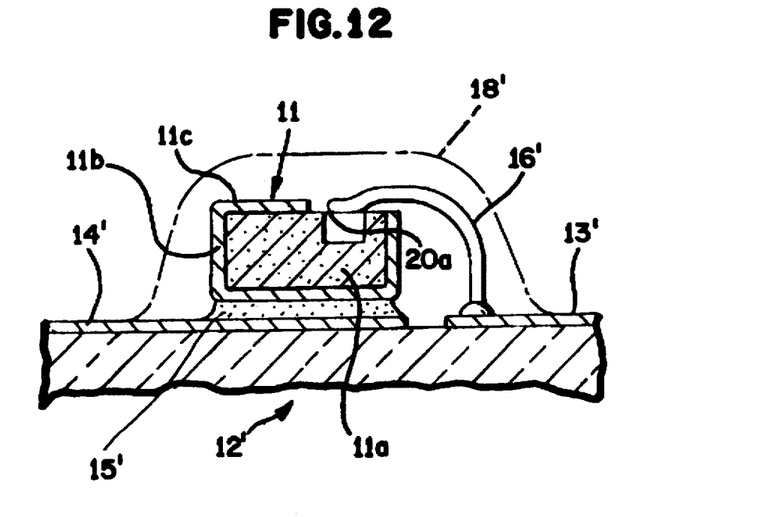
FIG. 12 is a sectional view showing a capacitor element and a circuit board carrying the element according to another embodiment of the present invention.
Figure 13:
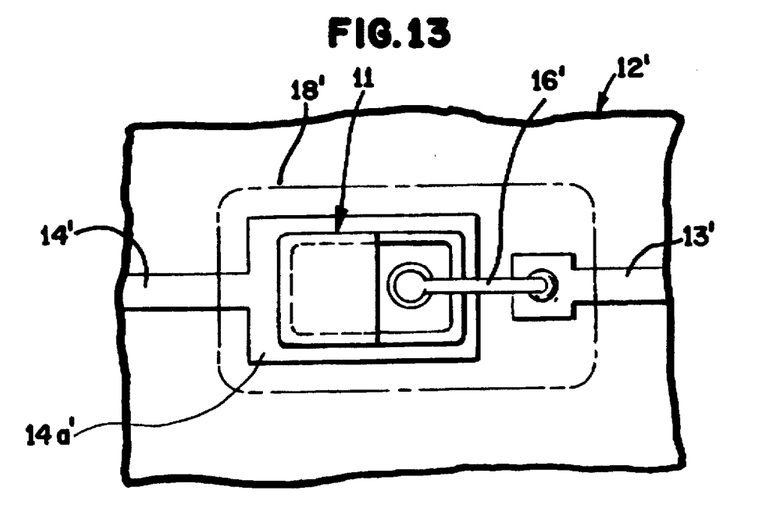
FIG. 13 is a plan view of FIG. 12.

FIGS. 12 and 13 illustrate a product capacitor produced by a second embodiment of the method according to the present invention. The capacitor element 11 used in the illustrated embodiment is the same type used in the first embodiment.

As shown in FIG. 12, the only difference between the first and second embodiments resides in that when attaching the capacitor element 11 to the board 12', the cathode terminal layer 11c of the capacitor element 11 is to be directly connected to a cathode pad 14' via a conductive adhesive 15' without using a metal wire. For this purpose, the cathode pad is preferably formed with an enlarged end portion 14'a which is large enough to support the entire bottom surface of the cathode terminal layer 11c, as shown in FIG. 13. Instead of using the conductive adhesive 15', the capacitor element 11 may be soldered to the cathode pad 14'. After these connecting operations, the capacitor element 11 and the metal wire 16' together with part of the pads 14' and 13' are enclosed by a resin member 18' made of an epoxy resin for example.

With such an arrangement, since there is no need to use a metal wire for connecting the cathode terminal layer 11c to the cathode pad 14', the overall longitudinal length and overall weight of the capacitor are further decreased. In addition, the production costs are further reduced because there is no need to perform a wire-bonding operation for the omitted metal wire.

Figure 14:
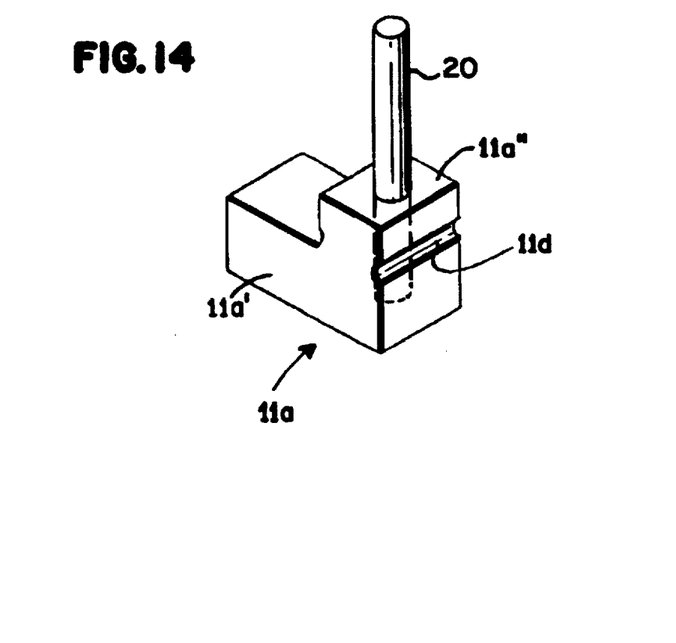
FIG. 14 is a perspective view showing another chip having a protruding portion.

FIG. 14 shows another capacitor chip 11a advantageously used in the present invention. The chip 11a includes a main portion 11a' and a protruding portion 11a" projecting from the main portion 11a'. The protruding portion 11a" is formed with two cutouts 11d adjacent to the main portion 11a'. Due to the presence of the cutouts 11d, the region 11e which is located therebetween is mechanically weaker than the other regions of the protruding portion 11a".

Figure 2:
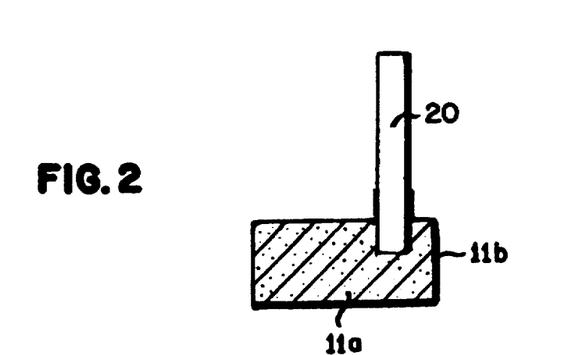
FIG. 2 is a sectional view showing the same chip of FIG. 1 with a dielectric substance formed on the chip.
Figure 15:
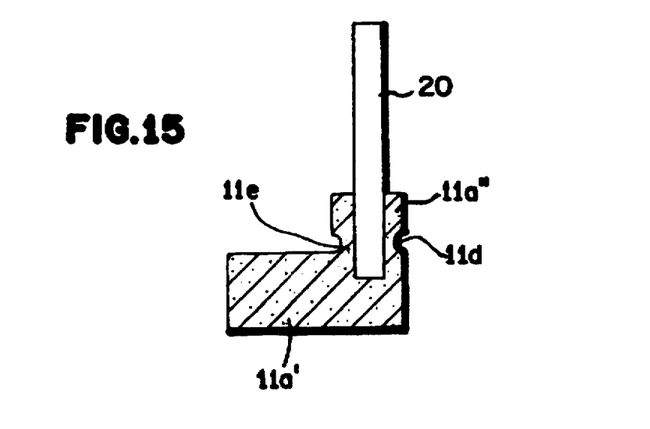
FIG. 15 is a sectional view of FIG. 14.
Figure 16:
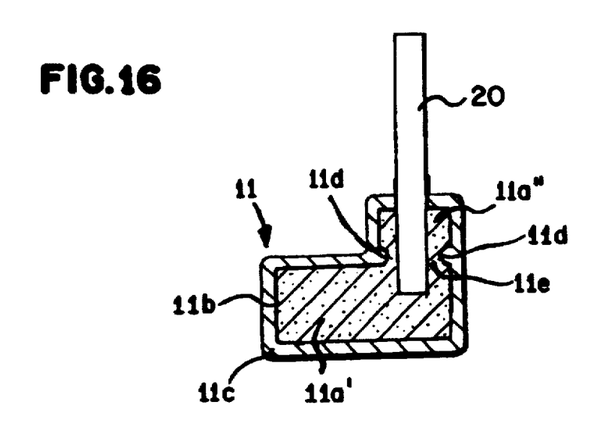
FIG. 16 is a sectional view of the same chip of FIG. 15 with a dielectric substance and a cathode terminal layer formed.

As shown in FIG. 15, the anode rod 20 penetrates the protruding portion 11a" and extends partially into the main portion 11a'. For the illustrated chip 11a, the same operations and treatments already described with reference to FIGS. 2 and 3 are performed for forming a dielectric substance 11b and a cathode terminal layer 11c on the chip 11a to produce a product capacitor element 11 as shown in FIG. 16.

Figure 17:
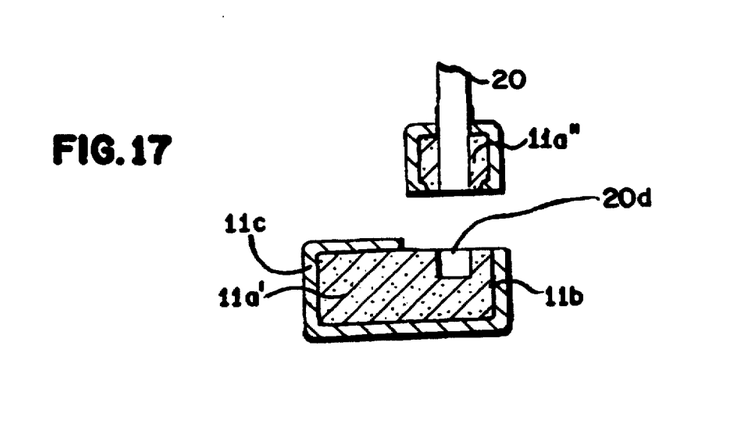
FIG. 17 is a sectional view showing the same chip with its protruding portion detached.

With such an arrangement, the protruding portion 11a" may be advantageously detached from the main portion 11a' only by breaking away the protruding portion 11a" at the weak region 11e, or preferably by cutting the weak portion 11a" with the use of a rotating cutter (not shown), so that the anode terminal surface 20a is readily exposed to the exterior.

Figure 18:
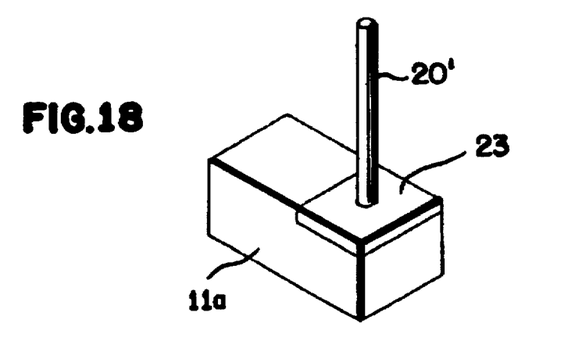
FIG. 18 is a perspective view showing another chip used in the present invention.
Figure 19:
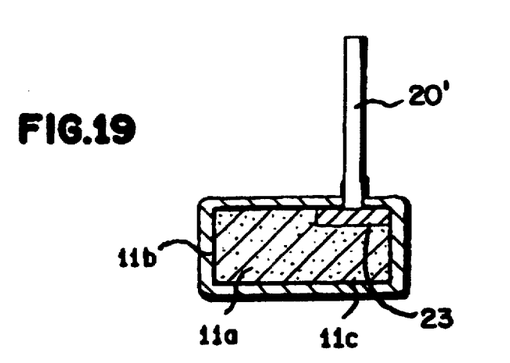
FIG. 19 is a sectional view of the same chip with a dielectric substance and a cathode terminal layer formed thereon.
Figure 20:
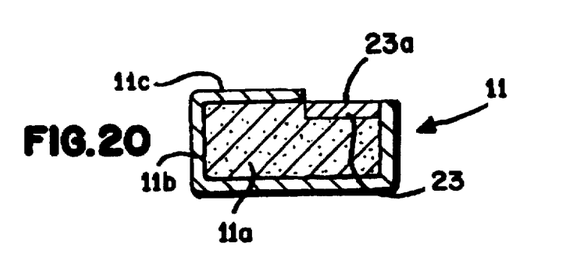
FIG. 20 is a sectional view of the same chip with a part of the cathode terminal layer removed.

Instead of utilizing the anode rod 20 imbedded in the chip 11a, a metal plate 23 made of e.g. tantalum is applicable, as shown in FIG. 18. In this instance again, a dielectric substance 11b and a cathode terminal layer 11c are formed on the chip 11a, as shown in FIG. 19, in the same manner described above with reference to the previous embodiment. Then, the part of the cathode terminal layer 11c corresponding to the upper surface of the metal plate 23 is removed together with a corresponding part of the dielectric substance 11b to expose a flat anode terminal surface 23a of the metal plate 23 to produce a product capacitor element 11.

With such an arrangement, a wire-bonding operation at the anode side is performed to the entirety of the anode terminal surface 23a having a larger area compared with the anode terminal surface 20a of the anode rod 20. Thus, the wire-bonding operation is more easily performed, even if the operation is done in a deviated manner. Further, due to the large area of the terminal surface 23a, the connection of the wire is advantageously increased in strength compared with the instance utilizing the anode rod 20.

The preferred embodiments of the present invention being thus described, it is obvious that the same may be varied in many ways. Such variations are not to be regarded as a departure from the spirit and the scope of the present invention, and all such modifications as would be obvious to those skilled in the art are intended to be included within the scope of the following claims.

We claim:

1. A method of mounting a solid electrolytic capacitor onto a printed circuit board; the printed circuit board comprising an anode pad and a cathode pad; the capacitor comprising a capacitor element which has an anode and a cathode electrically separated by a dielectric substance, the cathode including an outer cathode terminal layer formed over the element; the method comprising the steps of:

removing a part of the cathode terminal layer to expose a flat anode terminal surface;

attaching the element to the printed circuit board for bringing the cathode terminal layer into electrical connection with the cathode pad;

electrically connecting the flat anode terminal surface to the anode pad via a metal wire; and enclosing the element in a resin member for protection.

2. The method according to claim 1, wherein the cathode terminal layer is brought into electrical connection with the cathode pad via another metal wire.

3. The method according to claim 2, wherein at least one of the metal wires is a safety fuse wire.

4. The method according to claim 1, wherein the electrical connection of the cathode terminal layer with the cathode pad is provided by an electrically conductive adhesive applied between the cathode terminal layer and the cathode pad.

5. The method according to claim 4, wherein the metal wire is a safety fuse wire.

6. The method according to claim 1, wherein the anode includes a metal rod and the flat anode terminal surface is provided by the metal rod.

7. The method according to claim 1, wherein the anode includes a metal plate and the flat anode terminal surface is provided by the metal plate.

8. The method according to claim 1, wherein the anode includes a main portion and a protruding portion extending from the main portion before the partial removal of the cathode terminal layer, the protruding portion having a mechanically weak region which facilitates detachment of the protruding portion from the main portion.

9. The method according to claim 8, wherein the weak region is provided by forming a cutout in the protruding portion.

10. An assembly of a solid electrolytic capacitor and a printed circuit board; the printed circuit board comprising an anode pad and a cathode pad; the capacitor comprising a capacitor element which has an anode and a cathode electrically separated by a dielectric substance, the cathode including an outer cathode terminal layer formed over the element, the element being attached to the printed circuit board for bringing the cathode terminal layer into electrical connection with the cathode pad, the element being enclosed in a resin member for protection, wherein a part of the cathode terminal layer is removed to expose a flat anode terminal surface which is electrically connected to the anode pad via a metal wire.

11. The assembly according to claim 10, wherein the cathode terminal layer is brought into electrical connection with the cathode pad via another metal wire.

12. The assembly according to claim 11, wherein at least one of the metal wires is a safety fuse wire.

13. The assembly according to claim 10, wherein the electrical connection of the cathode terminal layer with the cathode pad is provided by an electrically conductive adhesive applied between the cathode terminal layer and the cathode pad.

14. The assembly according to claim 13, wherein the metal wire is a safety fuse wire.

15. The assembly according to claim 10, wherein the anode includes a metal rod and the flat anode terminal surface is provided by the metal rod.

16. The assembly according to claim 10, wherein the anode includes a metal plate and the flat anode terminal surface is provided by the metal plate.

* * * * *